(12) United States Patent
Hara et al.

(10) Patent No.: US 11,913,828 B2
(45) Date of Patent: Feb. 27, 2024

(54) VIBRATION SENSOR

(71) Applicant: Mitsubishi Electric Corporation, Tokyo (JP)

(72) Inventors: Rokuzo Hara, Tokyo (JP); Tomonori Kimura, Tokyo (JP); Koji Ibata, Tokyo (JP); Yasuhiro Nishioka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 360 days.

(21) Appl. No.: 17/504,602

(22) Filed: Oct. 19, 2021

(65) Prior Publication Data

US 2022/0034711 A1 Feb. 3, 2022

Related U.S. Application Data

(63) Continuation of application No. PCT/JP2019/019155, filed on May 14, 2019.

(51) Int. Cl.
G01H 11/08 (2006.01)
G01H 1/00 (2006.01)
H10N 30/30 (2023.01)

(52) U.S. Cl.
CPC ........... *G01H 11/08* (2013.01); *H10N 30/302* (2023.02)

(58) Field of Classification Search
CPC .... G01H 1/00–16; G01H 11/00; G01H 11/08; G01H 17/00; H10N 30/302
See application file for complete search history.

(56) References Cited

U.S. PATENT DOCUMENTS 6,393,920 B1 * 5/2002 Toda ................. G01H 11/08
310/334
2021/0404866 A1 * 12/2021 Kimura ................. G01L 1/167

FOREIGN PATENT DOCUMENTS

| JP | 2000329612 A | * | 11/2000 | ............... A61B 7/04 |
| JP | 2013-57627 A | | 3/2013 | |
| KR | 0129958 Y1 | * | 5/1999 | ............. G01H 11/08 |
| WO | WO 2017/138542 A1 | | 8/2017 | |

* cited by examiner

Primary Examiner — Nguyen Q. Ha
(74) Attorney, Agent, or Firm — Birch, Stewart, Kolasch & Birch, LLP

(57) ABSTRACT

A test object includes a sensor housing for vibrating together with a test object in synchronism with vibration of the test object; a piezoelectric substrate for vibrating together with the sensor housing in synchronism with vibration of the sensor housing, where a first interdigital electrode, a first terminal, a second interdigital electrode, and a second terminal are disposed on a first surface of the piezoelectric substrate, and the piezoelectric substrate is disposed inside the sensor housing to be fixed to the sensor housing; an amplifier for receiving a signal output from the second terminal as an input signal, amplifying the received input signal, and transmitting the input signal after the amplification to the first terminal as an output signal; a deformable layer being elastic and having a first surface adhered to a second surface of the piezoelectric substrate; and a heavy object having a first surface adhered to a second surface of the deformable layer.

8 Claims, 8 Drawing Sheets

VIBRATION SENSOR

CROSS REFERENCE TO RELATED APPLICATIONS

This application is a Continuation of PCT International Application No. PCT/JP2019/019155, filed on May 14, 2019, which is hereby expressly incorporated by reference into the present application.

TECHNICAL FIELD

This invention relates to a vibration sensor.

BACKGROUND ART

A certain type of vibration sensor causes a predetermined portion thereof to vibrate together with a test object in synchronism with vibration of the test object, and converts the vibration of the predetermined portion into an electrical signal, thereby detecting the vibration of the test object. For example, Patent Literature 1 discloses a vibration sound detection sensor that includes a piezoelectric substrate, an input interdigital electrode, an output interdigital electrode, a diaphragm, an amplifier, and a vibration propagating member and that detects a vibration sound occurring on a test object in contact with the vibration propagating member.

CITATION LIST

Patent Literatures

Patent Literature 1: JP 2013-57627 A

SUMMARY OF INVENTION

Technical Problem

However, a conventional vibration sensor including a predetermined portion to be attached to a test object, such as the vibration sound detection sensor disclosed in Patent Literature 1, when vibration occurring in the test object is a low frequency vibration, will entirely move with the test object in synchronism with the vibration. That is, in such case, in the conventional vibration sensor, a portion for converting vibration of the predetermined portion into an electrical signal does not vibrate relative to the predetermined portion. This prevents conversion of vibration of the test object into an electrical signal.

This invention is directed to solve the foregoing problem, and it is an object of this invention to provide a vibration sensor capable of detecting a low frequency vibration occurring in a test object.

Solution to Problem

A vibration sensor according to this invention includes: a sensor housing to vibrate together with a test object in synchronism with vibration of the test object; a piezoelectric substrate to vibrate together with the sensor housing in synchronism with vibration of the sensor housing, where a first interdigital electrode, a first terminal to input a signal into the first interdigital electrode, a second interdigital electrode, and a second terminal to output a signal from the second interdigital electrode are arranged on a first surface of the piezoelectric substrate, and the piezoelectric substrate is disposed inside the sensor housing to be fixed to the sensor housing; an amplifier to receive the signal output from the second terminal as an input signal, to amplify the received input signal, and to transmit the input signal after the amplification to the first terminal as an output signal; a deformable layer being elastic and having a first surface adhered to a second surface of the piezoelectric substrate; and a heavy object having a first surface adhered to a second surface of the deformable layer.

Advantageous Effects of Invention

This invention enables detection of a low frequency vibration occurring in a test object.

DESCRIPTION OF EMBODIMENTS

Embodiments of this invention will be described in detail below with reference to the drawings.

First Embodiment

A configuration of a vibration sensor 100 according to a first embodiment will now be described with reference to FIGS. 1 and 2.

Figure 1:
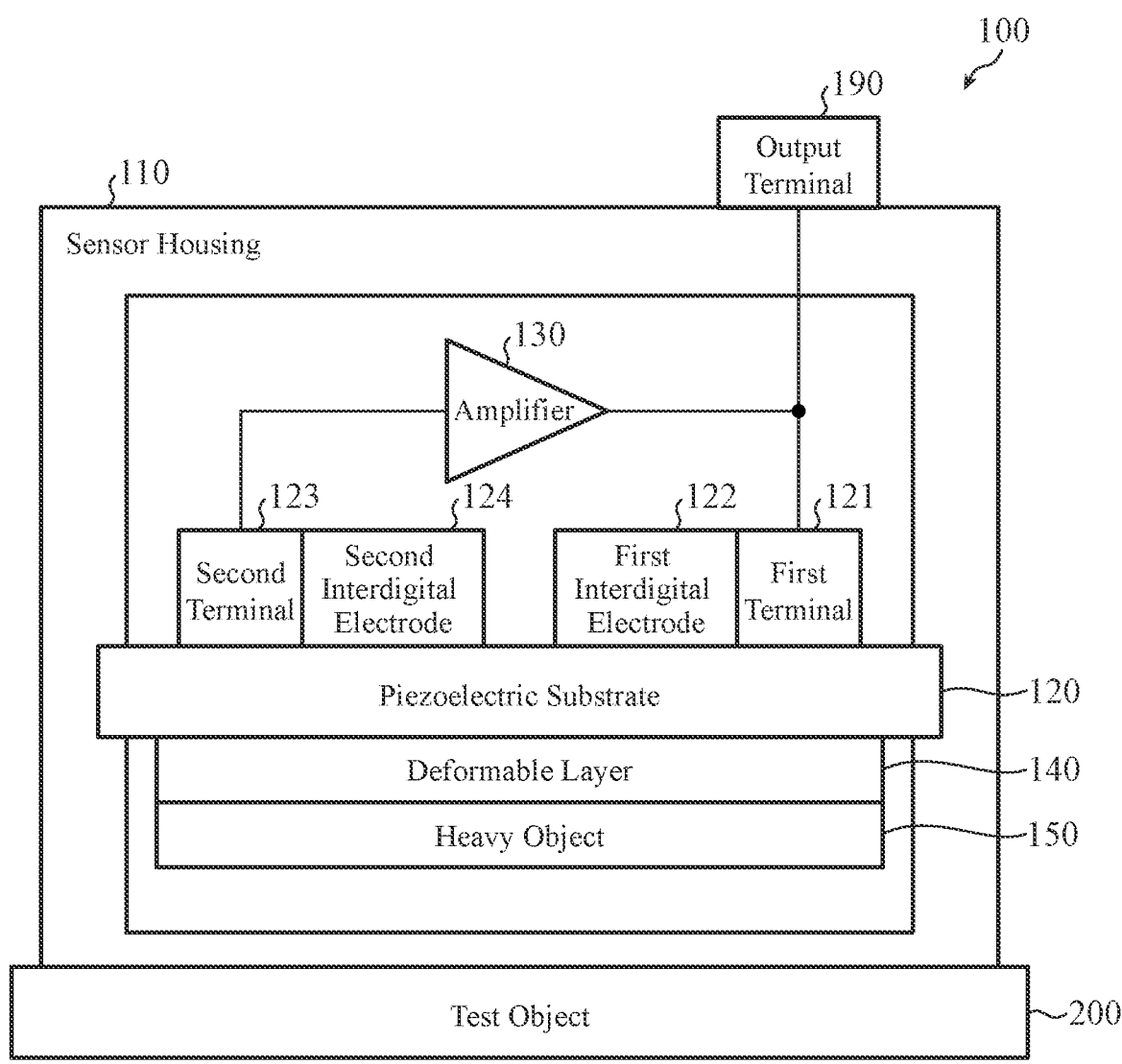
FIG. 1 is a cross-sectional view illustrating an example of the structure of a main portion of a vibration sensor according to a first embodiment.

FIG. 1 is a cross-sectional view illustrating an example of the structure of a main portion of the vibration sensor 100 according to the first embodiment. Note that the illustration of FIG. 1 assumes that acceleration of gravity acts in the direction from the vibration sensor 100 toward a test object 200.

The vibration sensor 100 according to the first embodiment includes a sensor housing 110, a piezoelectric substrate 120, an amplifier 130, a deformable layer 140, a heavy object 150, and an output terminal 190.

The sensor housing 110 is made of a highly rigid material such as ceramic or metal. The sensor housing 110 is attached to the test object 200. The sensor housing 110 vibrates together with the test object 200 in synchronism with vibration of the test object 200.

The piezoelectric substrate 120 is made of a piezoelectric material.

The piezoelectric substrate 120 is disposed inside the sensor housing 110 to be fixed to the sensor housing 110, and vibrates together with the sensor housing 110 in synchronism with vibration of the sensor housing 110. The piezoelectric substrate 120 is fixed to the sensor housing 110 by use of a highly rigid structure such as fitting or screwing. In addition, the piezoelectric substrate 120 includes a first interdigital electrode 122, a first terminal 121 for inputting a signal into the first interdigital electrode 122, a second interdigital electrode 124, and a second terminal 123 for outputting a signal from the second interdigital electrode 124, each disposed on a first surface of the piezoelectric substrate 120.

Figure 2:
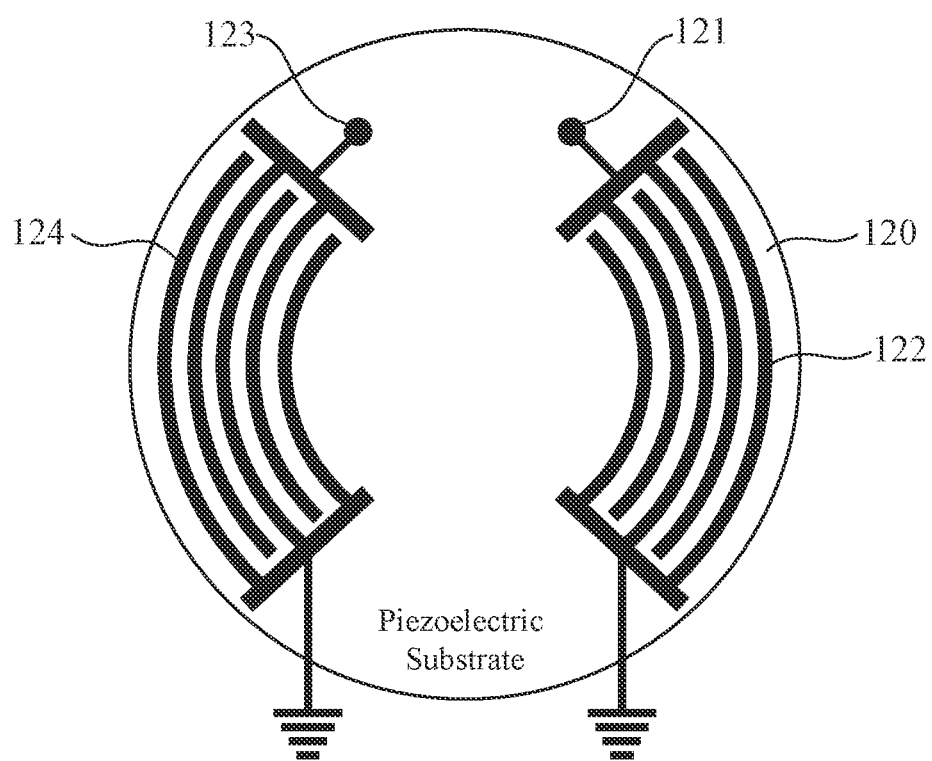
FIG. 2 is a configuration diagram illustrating an example of the configuration of the main portion on a first surface of a piezoelectric substrate according to the first embodiment.

FIG. 2 is a configuration diagram illustrating an example of the configuration of the main portion on the first surface of the piezoelectric substrate 120 according to the first embodiment.

As illustrated in FIG. 2, the first interdigital electrode 122 and the second interdigital electrode 124 each include a pair of multiple electrodes. One of the pair of the electrodes of the first interdigital electrode 122 is connected to the first terminal 121, and the other one thereof is grounded. In addition, one of the pair of the electrodes of the second interdigital electrode 124 is connected to the second terminal 123, and the other one thereof is grounded. Although the first interdigital electrode 122 and the second interdigital electrode 124 illustrated in FIG. 2 each have an arc shape, the shape of each of the first interdigital electrode 122 and the second interdigital electrode 124 is not limited to an arc shape, but may also be a rectangular or another shape. Moreover, although the piezoelectric substrate 120 illustrated in FIG. 2 has a circular shape, the shape of the piezoelectric substrate 120 is not limited to a circular shape, but may also be, for example, a rectangular or another shape to fit the shape of the sensor housing 110.

The amplifier 130 receives, as an input signal, a signal output from the second terminal 123, amplifies the received input signal, and outputs, as an output signal, the input signal after the amplification. The amplifier 130 is supplied with electrical power from a drive power supply (not illustrated) to amplify the input signal. A part of the output signal output from the amplifier 130 is transmitted to the first terminal 121, and the rest thereof is transmitted to the output terminal 190.

The output terminal 190 is a terminal for outputting the output signal received from the amplifier 130, to an external device (not illustrated) such as a signal analysis device.

The deformable layer 140 has a first surface adhered to a second surface of the piezoelectric substrate 120. The deformable layer 140 and the piezoelectric substrate 120 are adhered to each other by adhesive such as a resin-based adhesive. The deformable layer 140 is elastic. The deformable layer 140 is made of an elastic material such as a synthetic resin, or the like. The material of the deformable layer 140 is not limited to a synthetic resin, as long as the deformable layer 140 is made of a material deformable by external force and capable of conveying ultrasound. Moreover, the adhesive for adhering together the deformable layer 140 and the piezoelectric substrate 120 is not limited to a resin-based adhesive, as long as the material is capable of conveying the ultrasound emitted from the piezoelectric substrate 120 to the deformable layer 140, and is capable of conveying the ultrasound transmitted from the deformable layer 140 to the piezoelectric substrate 120.

The heavy object 150 has a first surface adhered to a second surface of the deformable layer 140. The heavy object 150 and the deformable layer 140 are adhered to each other by adhesive such as a resin-based adhesive. The heavy object 150 is made of a substance having a high specific gravity, for example, a metal such as copper, lead, or iron or an alloy such as stainless steel. The adhesive for adhering together the heavy object 150 and the deformable layer 140, and the heavy object 150 are made of a substance that causes the ultrasound propagated through the deformable layer 140 to be reflected at the interface between the heavy object 150 and the deformable layer 140, i.e., at the adhesion surfaces of the heavy object 150 and of the deformable layer 140.

As described above, vibration of the test object 200 causes the sensor housing 110 to vibrate together with the test object 200 in synchronism with the vibration of the test object 200. In addition, due to the piezoelectric substrate 120 being fixed to the sensor housing 110, the piezoelectric substrate 120 vibrates together with the sensor housing 110 in synchronism with the vibration of the sensor housing 110. In this case, the heavy object 150 behaves to keep a current position due to inertia. As a result, the heavy object 150 vibrates relative to the piezoelectric substrate 120 whose vibration is induced by the vibration of the test object 200. Since the deformable layer 140 is made of an elastic material, the deformable layer 140 sandwiched between the piezoelectric substrate 120 and the heavy object 150 is to be deformed depending on the relative vibration of the heavy object 150 to the piezoelectric substrate 120. That is, when the test object 200 vibrates, the deformable layer 140 is deformed depending on the vibration of the test object 200. Note that the heavy object 150 has a sufficient weight to deform the deformable layer 140 depending on the vibration of the piezoelectric substrate 120.

An operation of the vibration sensor 100 according to the first embodiment will now be described with reference to FIGS. 3 to 5.

The first interdigital electrode 122 receives an electrical signal output from a signal generator (not illustrated) via the first terminal 121. The electrical signal applied by the signal generator to the first interdigital electrode 122 has a frequency, for example, generally equal to the center frequency corresponding to the electrode cycle length of the first interdigital electrode 122. Upon reception of an electrical signal from the signal generator, the first interdigital electrode 122 efficiently excites, on the piezoelectric substrate 120, a leaky Lamb wave having a wavelength generally equal to the electrode cycle length of the first interdigital electrode 122.

The piezoelectric substrate 120 converts the mode of the leaky Lamb wave at the interface between the piezoelectric substrate 120 and the deformable layer 140, and emits, to the deformable layer 140, ultrasound which is a longitudinal wave.

Figure 3:
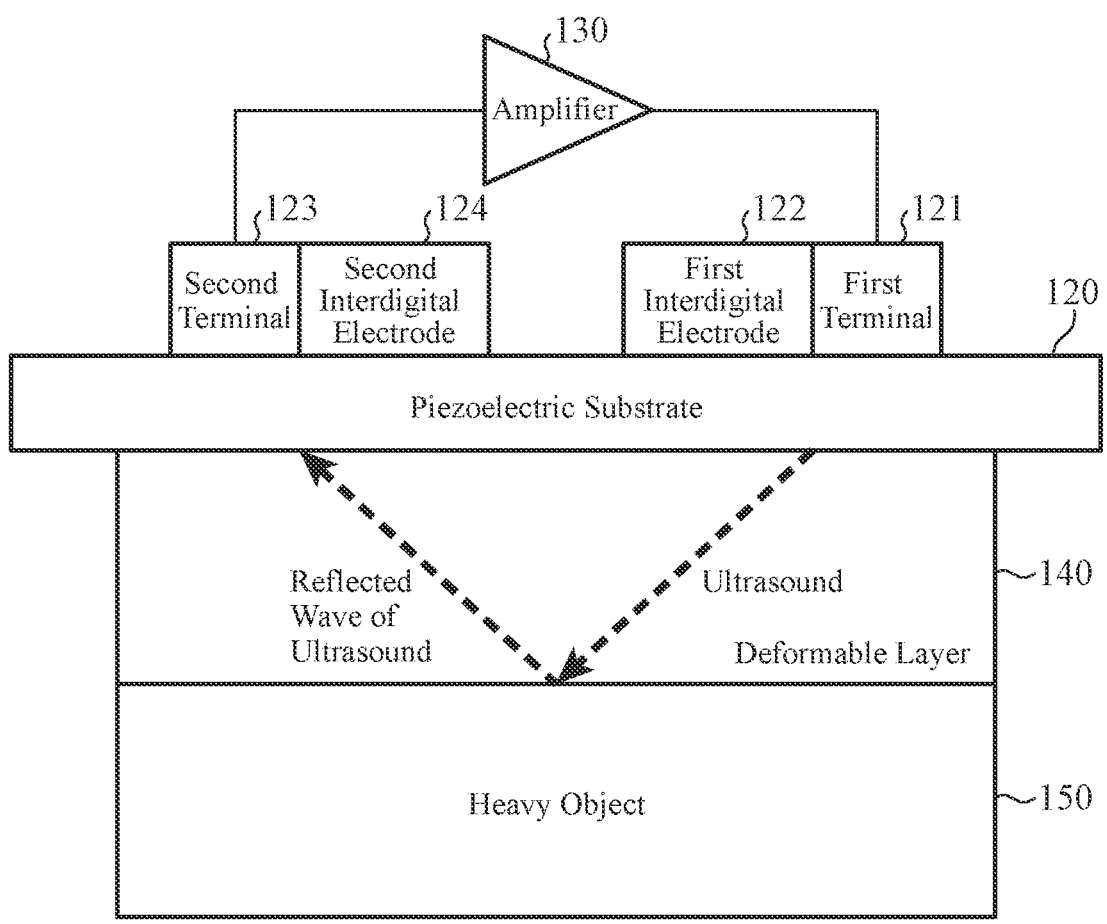
FIG. 3 is a diagram illustrating an example of a propagation path of ultrasound emitted to a deformable layer according to the first embodiment.

FIG. 3 is a diagram illustrating an example of propagation path of the ultrasound emitted to the deformable layer 140 according to the first embodiment.

The deformable layer 140 conveys the ultrasound emitted from the piezoelectric substrate 120. The ultrasound conveyed by the deformable layer 140 is reflected at the interface between the deformable layer 140 and the heavy object 150. A reflected wave of the ultrasound reflected at the interface is conveyed by the deformable layer 140 to reach the piezoelectric substrate 120.

The reflected wave of the ultrasound that has reached the piezoelectric substrate 120 is detected by the second interdigital electrode 124, as an electrical signal having a frequency corresponding to the electrode cycle length of the second interdigital electrode 124. The electrical signal detected by the second interdigital electrode 124 is input, as an input signal, into the amplifier 130 from the second terminal 123. Note that the second interdigital electrode 124 has an electrode cycle length generally equal to the electrode cycle length of the first interdigital electrode 122.

As described above, the amplifier 130 amplifies the input signal, and outputs the input signal after the amplification, as an output signal. A part of the output signal output from the amplifier 130 is transmitted to the first terminal 121, and the rest thereof is transmitted to the output terminal 190.

The first interdigital electrode 122 receives, via the first terminal 121, the part of the output signal output from the amplifier 130.

Thus, the first interdigital electrode 122, the piezoelectric substrate 120, the second interdigital electrode 124, and the amplifier 130 together form a recursive oscillator.

Figure 4:
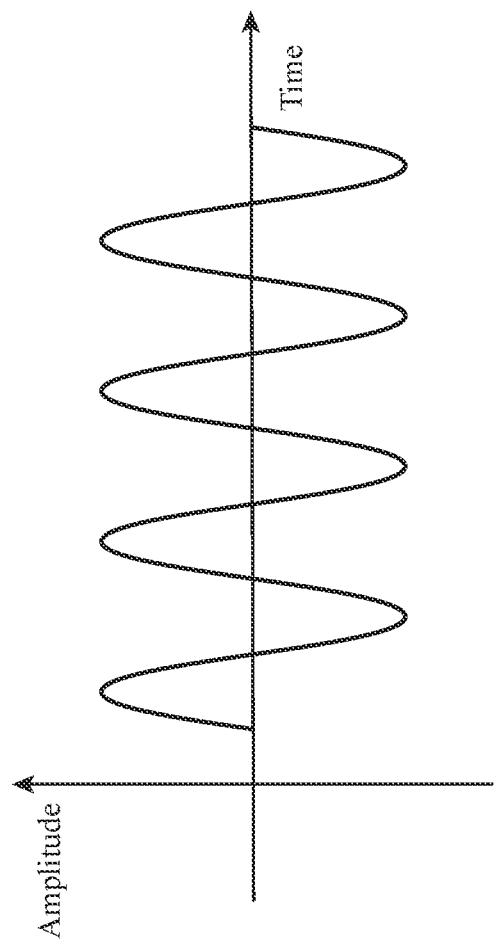
FIG. 4 is a diagram illustrating an example of a signal output from an output terminal during a steady state in which a test object is not vibrating, in the vibration sensor according to the first embodiment.

FIG. 4 is a diagram illustrating an example of the signal output from the output terminal 190 during a steady state in which the test object 200 is not vibrating, in the vibration sensor 100 according to the first embodiment.

In FIG. 4, the horizontal axis represents the time, and the vertical axis represents the magnitude of the amplitude of the signal.

As illustrated in FIG. 4, the signal output from the output terminal 190 has a constant period in a steady state in which the test object 200 is not vibrating.

As described above, when the test object 200 vibrates, the deformable layer 140 is deformed depending on the vibration of the test object 200.

Deformation of the deformable layer 140 changes the propagation distance of the ultrasound conveyed by the deformable layer 140. In particular, when the vibration of the test object 200 causes the sensor housing 110 to vibrate in the direction of stacking of the piezoelectric substrate 120, the deformable layer 140, and the heavy object 150 (hereinafter referred to as "stacking direction"), the propagation distance of the ultrasound is changed. When the propagation distance of the ultrasound is changed, the reflected wave of the ultrasound is changed in frequency relative to the frequency before reflection due to Doppler effect.

Figure 5:
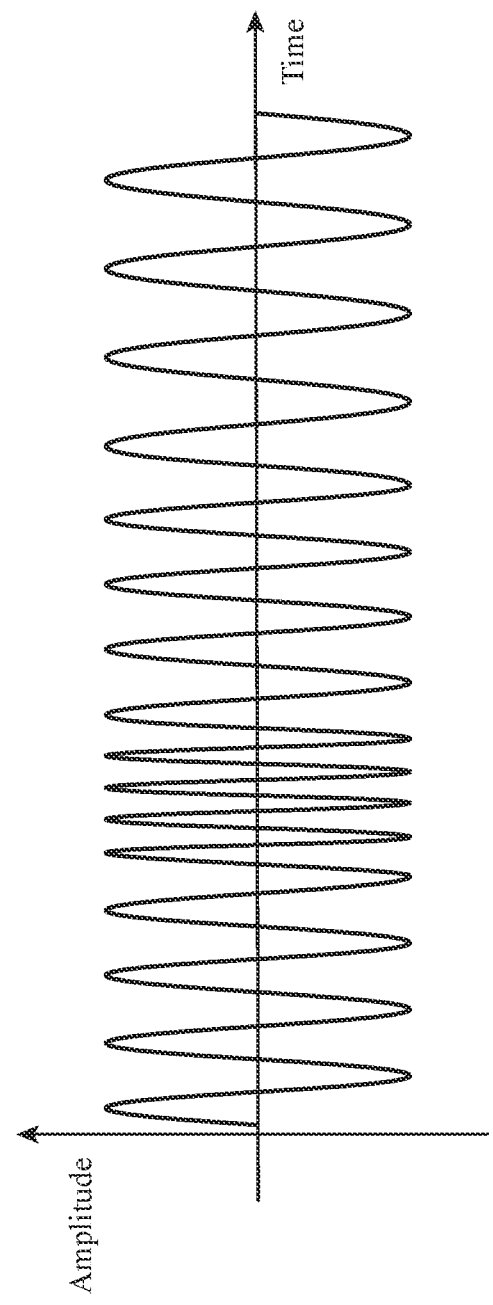
FIG. 5 is a diagram illustrating an example of a signal output from the output terminal during a state in which the test object is vibrating, in the vibration sensor according to the first embodiment.

FIG. 5 is a diagram illustrating an example of the signal output from the output terminal 190 during a state in which the test object 200 is vibrating, in the vibration sensor 100 according to the first embodiment.

In FIG. 5, the horizontal axis represents the time, and the vertical axis represents the magnitude of the amplitude of the signal.

As illustrated in FIG. 5, the signal output from the output terminal 190 changes its period in a state in which the test object 200 is vibrating.

An external device such as a signal analysis device detects a change in the period, the frequency, the phase, etc. of the signal output from the output terminal 190 to determine whether or not the test object 200 is vibrating. For example, the vibration sensor 100 and an external device such as a signal analysis device together form a vibration detection system for detecting vibration of the test object 200.

As described above, the vibration sensor 100 includes the sensor housing 110 for vibrating together with the test object 200 in synchronism with vibration of the test object 200; the piezoelectric substrate 120 for vibrating together with the sensor housing 110 in synchronism with vibration of the sensor housing 110, where the first interdigital electrode 122, the first terminal 121 for inputting a signal into the first interdigital electrode 122, the second interdigital electrode 124, and the second terminal 123 for outputting a signal from the second interdigital electrode 124 are disposed on a first surface of the piezoelectric substrate 120, and the piezoelectric substrate 120 is disposed inside the sensor housing 110 to be fixed to the sensor housing 110; the amplifier 130 for receiving the signal output from the second terminal 123 as an input signal, amplifying the received input signal, and transmitting the input signal after the amplification to the first terminal 121 as an output signal; the deformable layer 140 being elastic and having a first surface adhered to a second surface of the piezoelectric substrate 120; and the heavy object 150 having a first surface adhered to a second surface of the deformable layer 140.

Such configuration enables the vibration sensor 100 to detect a low frequency vibration occurring on the test object 200.

Second Embodiment

A vibration sensor 100a according to a second embodiment will now be described with reference to FIGS. 6 and 7.

Figure 6:
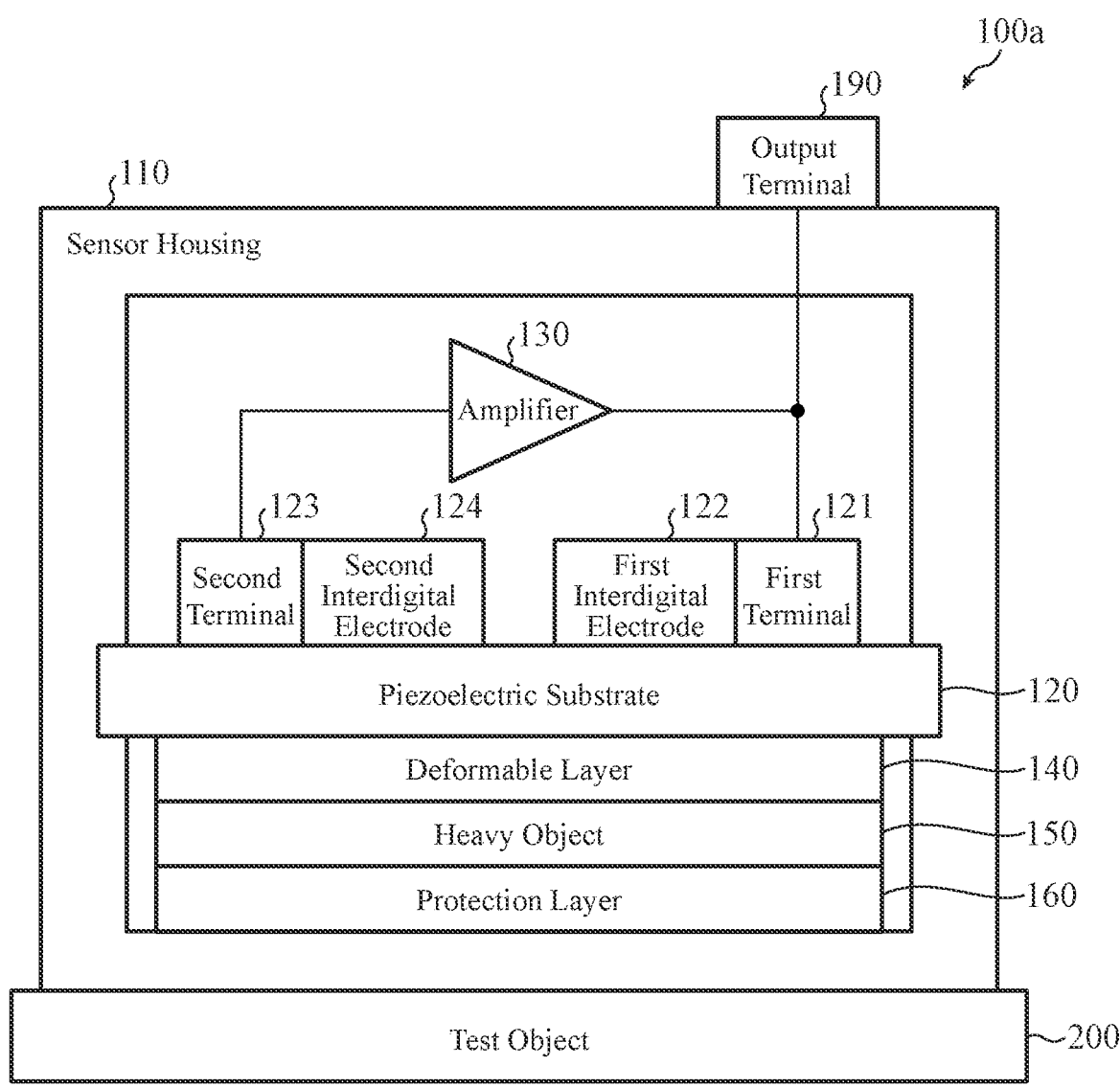
FIG. 6 is a cross-sectional view illustrating an example of the configuration of a main portion of a vibration sensor according to a second embodiment.

FIG. 6 is a cross-sectional view illustrating the configuration of a main portion of the vibration sensor 100a according to the second embodiment.

Figure 7:
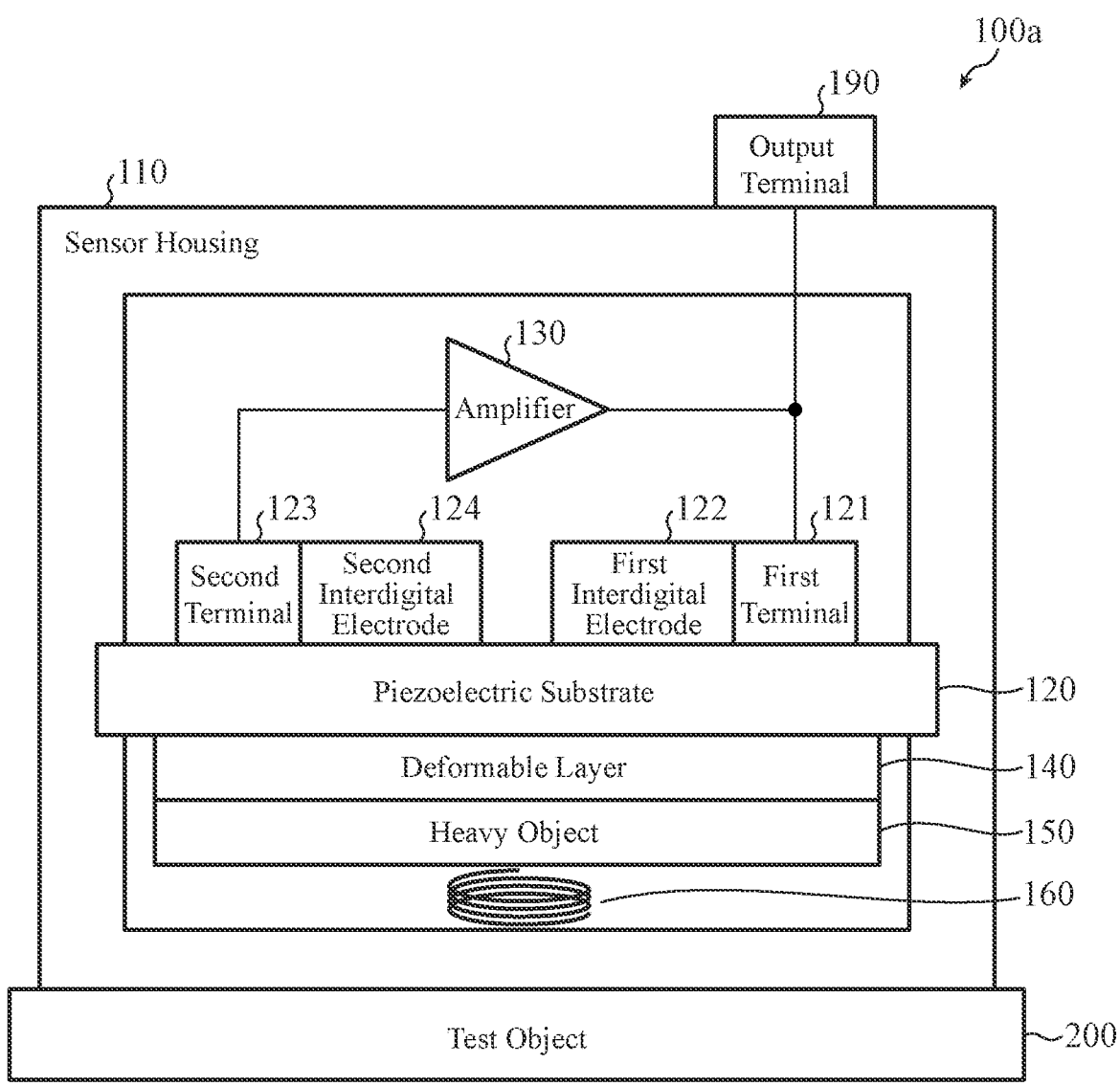
FIG. 7 is a cross-sectional view illustrating an example of the configuration of the main portion of the vibration sensor according to the second embodiment.

FIG. 7 is a cross-sectional view illustrating the configuration of the main portion of the vibration sensor 100a according to the second embodiment.

The vibration sensor 100a according to the second embodiment further includes a protection layer 160 in addition to the components included in the vibration sensor 100 according to the first embodiment.

Components of the vibration sensor 100a according to the second embodiment similar to the components of the vibration sensor 100 according to the first embodiment are designated by like reference characters, and duplicate description thereof will be omitted. That is, the similar components in FIGS. 6 and 7 designated by reference characters identical to the reference characters given in FIG. 1 will be left out of the following description.

The vibration sensor 100a according to the second embodiment includes the sensor housing 110, the piezoelectric substrate 120, the amplifier 130, the deformable layer 140, the heavy object 150, the protection layer 160, and the output terminal 190.

The protection layer 160 has a first portion being fixed to a second surface of the heavy object 150 opposite the first surface of the heavy object 150, and a second portion being fixed to an inner wall of the sensor housing 110.

The protection layer 160 is elastic. The protection layer 160 is made of an elastic material such as a resin, or the like.

FIG. 6 illustrates, by way of example, a vibration sensor 100a including a protection layer 160 made of an elastic material such as a resin, or the like.

The protection layer 160 illustrated in FIG. 6 has, for example, a first surface of the protection layer 160 being fixed by adhesion to the second surface of the heavy object 150, and a second surface of the protection layer 160 opposite the first surface of the protection layer 160 being fixed by adhesion to the inner wall of the sensor housing 110. The protection layer 160 and the heavy object 150 are adhered to each other by adhesive such as a resin-based adhesive, or the like. In addition, the protection layer 160 and the inner wall of the sensor housing 110 are adhered to each other by adhesive such as a resin-based adhesive, or the like.

Note that although FIG. 6 illustrates, by way of example, an example in which the protection layer 160 is adhered over the entire surface of the second surface of the heavy object 150, the protection layer 160 is not limited to one that is adhered over the entire surface of the second surface of the heavy object 150, but may be one being adhered to part of the second surface of the heavy object 150.

Alternatively, the protection layer 160 may have a spring structure.

FIG. 7 illustrates, by way of example, a vibration sensor 100*a* including a protection layer 160 formed by a spring made of a material such as a metal or a resin, as the spring structure.

The spring serving as the protection layer 160 illustrated in FIG. 7 has one end fixed to the second surface of the heavy object 150, and another end fixed to the inner wall of the sensor housing 110. The spring serving as the protection layer 160 is fixed to the heavy object 150 by adhesive such as a resin-based adhesive, or the like. In addition, the spring serving as the protection layer 160 is fixed to the inner wall of the sensor housing 110 by adhesive such as a resin-based adhesive, or the like.

Note that although FIG. 7 illustrates, by way of example, an example in which one spring serves as the protection layer 160, the number of springs that serve as the protection layer 160 is not limited to one, but the protection layer 160 may include multiple springs each having a spring structure.

A case such as a large amplitude of vibration of the test object 200, or a period of vibration of the test object 200 generally equal to a period corresponding to the natural frequency of the deformable layer 140 sandwiched between the piezoelectric substrate 120 and the heavy object 150 will cause large deformation of the deformable layer 140. This may cause, for example, collision of the heavy object 150 with the inner wall of the sensor housing 110, or plastic deformation of the deformable layer 140.

The protection layer 160 can limit the magnitude of vibration of the heavy object 150 relative to the sensor housing 110, and can, in turn, limit deformation of the deformable layer 140.

As described above, the vibration sensor 100*a* includes the sensor housing 110 for vibrating together with the test object 200 in synchronism with vibration of the test object 200; the piezoelectric substrate 120 for vibrating together with the sensor housing 110 in synchronism with vibration of the sensor housing 110, where the first interdigital electrode 122, the first terminal 121 for inputting a signal into the first interdigital electrode 122, the second interdigital electrode 124, and the second terminal 123 for outputting a signal from the second interdigital electrode 124 are disposed on a first surface of the piezoelectric substrate 120, and the piezoelectric substrate 120 is disposed inside the sensor housing 110 to be fixed to the sensor housing 110; the amplifier 130 for receiving the signal output from the second terminal 123 as an input signal, amplifying the received input signal, and transmitting the input signal after the amplification to the first terminal 121 as an output signal; the deformable layer 140 being elastic and having a first surface adhered to a second surface of the piezoelectric substrate 120; the heavy object 150 having a first surface adhered to a second surface of the deformable layer 140; and the protection layer 160 being elastic, having a first portion being fixed to a second surface of the heavy object 150 opposite the first surface of the heavy object 150, and having a second portion having a part being fixed to an inner wall of the sensor housing 110.

Such a configuration enables the vibration sensor 100*a* to detect a low frequency vibration occurring on the test object 200.

Such a configuration also enables the vibration sensor 100*a* to limit the magnitude of vibration of the heavy object 150 relative to the sensor housing 110, and can, in turn, limit deformation of the deformable layer 140. The capability of the vibration sensor 100*a* of limiting the magnitude of vibration of the heavy object 150 relative to the sensor housing 110 enables the vibration sensor 100*a* to prevent collision of the heavy object 150 with the inner wall of the sensor housing 110. In addition, the capability of limiting of deformation of the deformable layer 140 enables the vibration sensor 100*a* to prevent plastic deformation of the deformable layer 140.

Such a configuration can further prevent the entire load of the heavy object 150 from being applied to the piezoelectric substrate 120.

Third Embodiment

An example of attaching of the vibration sensor 100 or the vibration sensor 100*a* to the test object 200 will now be described with reference to FIGS. 8 and 9.

Figure 8:
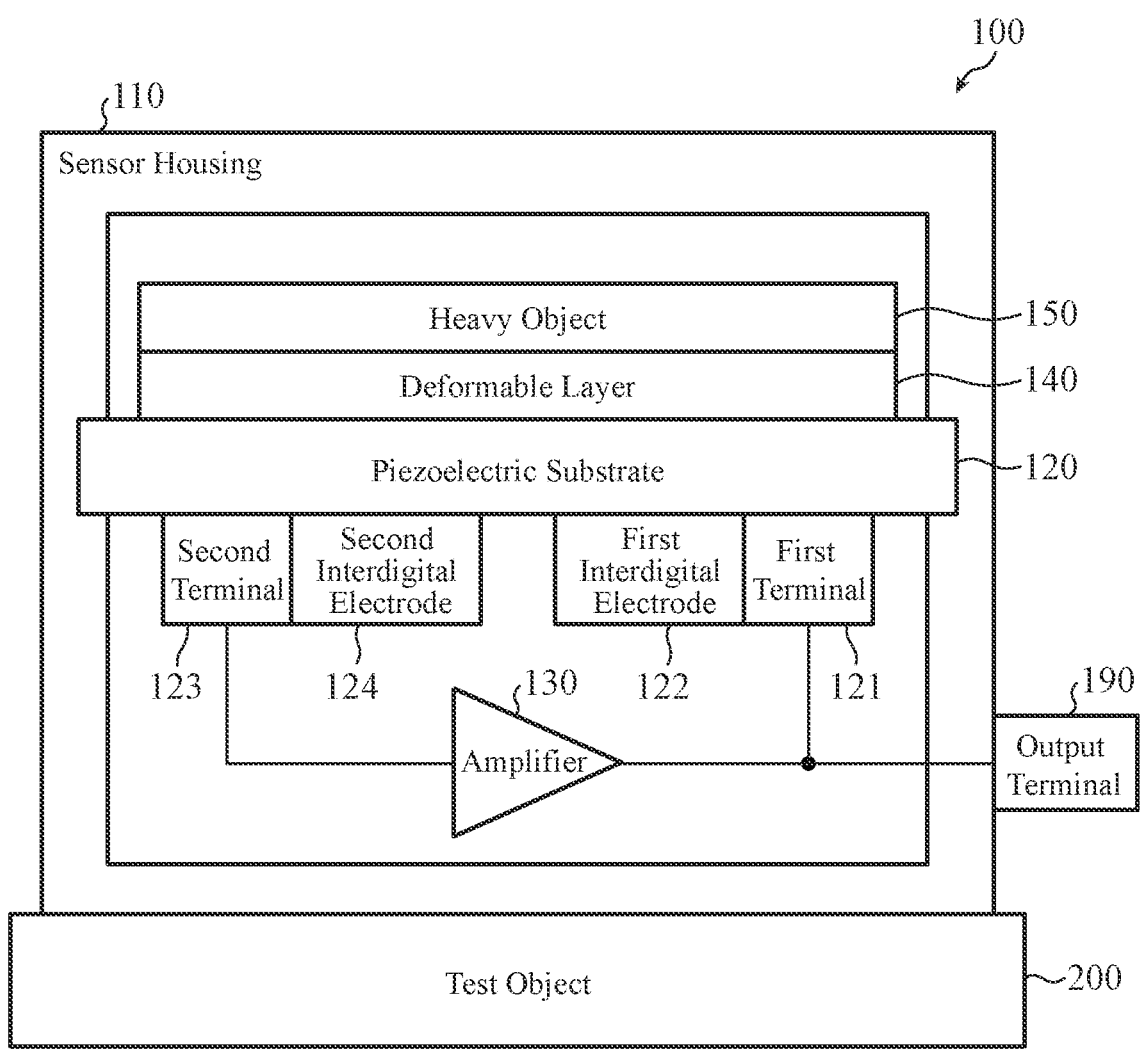
FIG. 8 is a cross-sectional view of the vibration sensor, illustrating an example of when the vibration sensor according to the first embodiment has been attached to the test object.

FIG. 8 is a cross-sectional view of the vibration sensor 100, illustrating an example of when the vibration sensor 100 according to the first embodiment has been attached to the test object 200.

Figure 9:
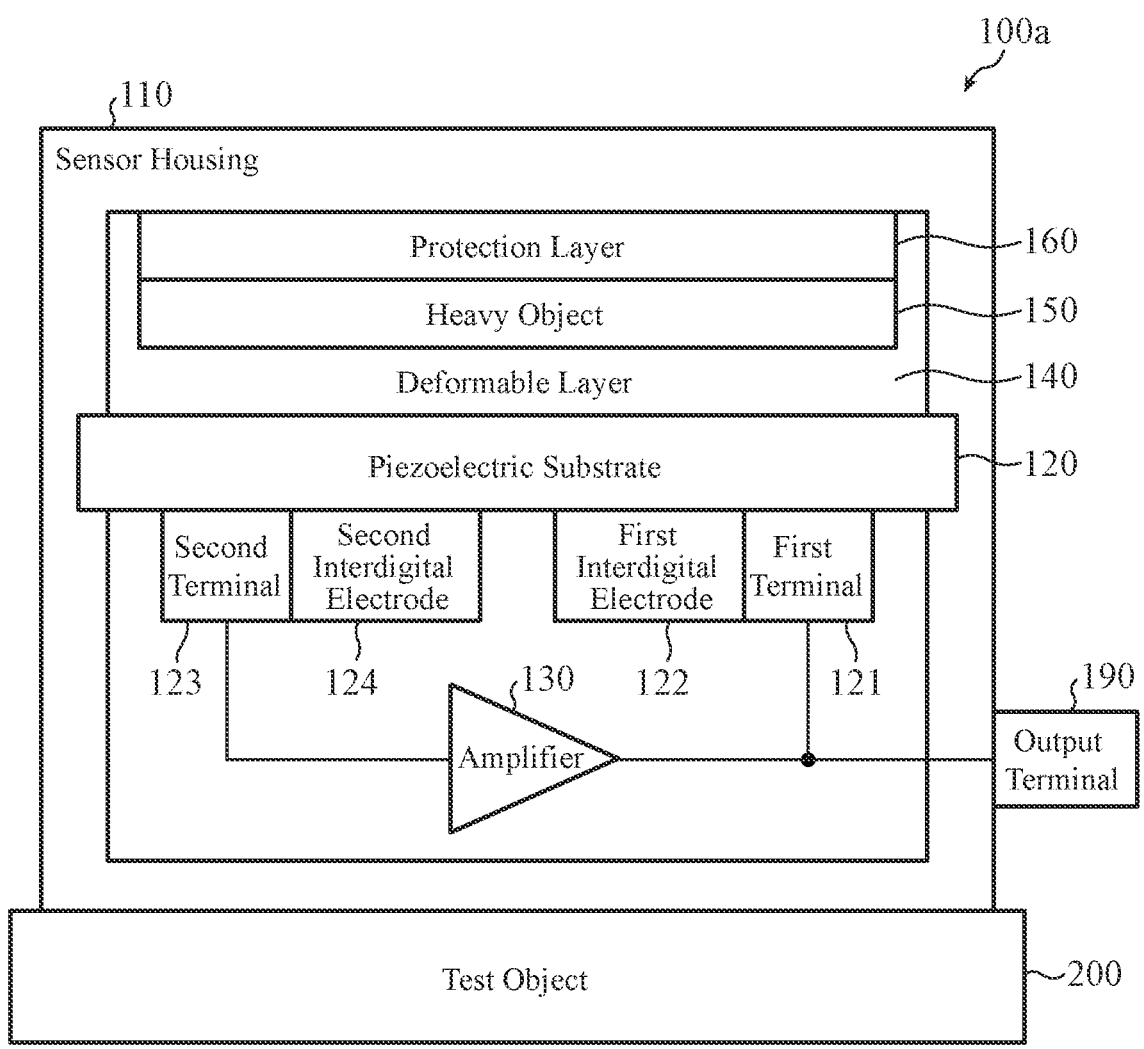
FIG. 9 is a cross-sectional view of the vibration sensor, illustrating an example of when the vibration sensor according to the second embodiment has been attached to the test object.

FIG. 9 is a cross-sectional view of the vibration sensor 100*a*, illustrating an example of when the vibration sensor 100*a* according to the second embodiment has been attached to the test object 200.

Note that the illustrations of FIGS. 8 and 9 assume that acceleration of gravity acts in the direction from the test object 200 toward the vibration sensor 100 or toward the vibration sensor 100*a*.

The vibration sensor 100 according to the first embodiment illustrated in FIG. 1 and the vibration sensor 100*a* according to the second embodiment illustrated in FIG. 6 or 7 are configured so that the test object 200 is attached to an outer wall of the sensor housing 110 that is nearer to the heavy object 150 than the piezoelectric substrate 120 in the stacking direction.

In contrast, the vibration sensor 100 illustrated in FIG. 8 and the vibration sensor 100*a* illustrated in FIG. 9 are configured so that the test object 200 is attached to an outer wall of the sensor housing 110 that is farther from the heavy object 150 than the piezoelectric substrate 120 in the stacking direction.

Note that, in order to attach together the above outer wall and the test object 200, the vibration sensor 100 illustrated in FIG. 8 and the vibration sensor 100*a* illustrated in FIG. 9 are configured so that the output terminal 190 is disposed on an outer wall different from the outer walls of the sensor housing 110 provided in the stacking direction.

The vibration sensor 100 and the vibration sensor 100*a* attached to the test object 200 as illustrated in FIGS. 8 and 9 are also capable of vibration detection described in the first embodiment and in the second embodiment.

In particular, by including the protection layer 160, the vibration sensor 100*a* illustrated in FIG. 9 can prevent the entire load of the heavy object 150 from being applied to the piezoelectric substrate 120.

Note that this invention covers any combination of the foregoing embodiments or of the variants of the embodiments, modification of any component in the embodiments or in the variants of the embodiments, or omission of any component in the embodiments or in the variants of the embodiments that fall within the scope of the invention.

In addition, the vibration sensor 100 or the vibration sensor 100a may have the amplifier 130 being disposed outside the sensor housing 110.

Moreover, when the amplifier 130 is disposed inside the sensor housing 110, in the vibration sensor 100 or the vibration sensor 100a the amplifier 130 can be supplied with the drive power via the output terminal 190, because the drive power applied to the amplifier 130 is a direct current voltage, and the drive power has a frequency different from the frequency of the signal output from the output terminal 190.

Furthermore, the vibration sensor 100 or the vibration sensor 100a may have an auxiliary function such as a function of limiting the direction of vibration to be measured, as provided by a conventional vibration sensor.

INDUSTRIAL APPLICABILITY

The vibration sensor according to this invention can be used in a vibration detection system.

REFERENCE SIGNS LIST 100, 100a: vibration sensor, 110: sensor housing, 120: piezoelectric substrate, 121: first terminal, 122: first interdigital electrode, 123: second terminal, 124: second interdigital electrode, 130: amplifier, 140: deformable layer, 150: heavy object, 160: protection layer, 190: output terminal, 200: test object

The invention claimed is:

1. A vibration sensor comprising:
   a sensor housing to vibrate together with a test object in synchronism with vibration of the test object;
   a piezoelectric substrate to vibrate together with the sensor housing in synchronism with vibration of the sensor housing, wherein a first interdigital electrode, a first terminal to input a signal into the first interdigital electrode, a second interdigital electrode, and a second terminal to output a signal from the second interdigital electrode are arranged on a first surface of the piezoelectric substrate, and the piezoelectric substrate is disposed inside the sensor housing to be fixed to the sensor housing;
   an amplifier to receive the signal output from the second terminal as an input signal, to amplify the received input signal, and to transmit the input signal after the amplification to the first terminal as an output signal;
   a deformable layer being elastic and having a first surface adhered to a second surface of the piezoelectric substrate; and
   a heavy object having a first surface adhered to a second surface of the deformable layer.

2. The vibration sensor according to claim 1, wherein the deformable layer is made of a resin.

3. The vibration sensor according to claim 1, comprising:
   a protection layer being elastic, having a first portion being fixed to a second surface of the heavy object opposite the first surface of the heavy object, and having a second portion having a part being fixed to an inner wall of the sensor housing.

4. The vibration sensor according to claim 2, comprising:
   a protection layer being elastic, having a first portion being fixed to a second surface of the heavy object opposite the first surface of the heavy object, and having a second portion having a part being fixed to an inner wall of the sensor housing.

5. The vibration sensor according to claim 3, wherein the protection layer is made of a resin.

6. The vibration sensor according to claim 4, wherein the protection layer is made of a resin.

7. The vibration sensor according to claim 3, wherein the protection layer has a spring structure.

8. The vibration sensor according to claim 4, wherein the protection layer has a spring structure.

* * * * *